April 4, 1967 G. C. BECK ET AL 3,312,325

CHIP ORIENTOR

Filed May 27, 1965 2 Sheets-Sheet 1

April 4, 1967 G. C. BECK ETAL 3,312,325

CHIP ORIENTOR

Filed May 27, 1965 2 Sheets-Sheet 2

United States Patent Office 3,312,325

Patented Apr. 4, 1967

3,312,325
CHIP ORIENTOR

George C. Beck, Fishkill, Jean J. L. Godat, Poughkeepsie, Arne H. Larsen, Wappingers Falls, and Thomas J. Rajac, Poughkeepsie, N.Y., assignors to International Business Machines Corporation, Armonk, N.Y., a corporation of New York Filed May 27, 1965, Ser. No. 459,343
7 Claims. (Cl. 198—33)

This invention relates to apparatus for assembling work pieces into component units, more specifically, to apparatus for automatically assembling semiconductor chips on printed circuit substrates. Still more specifically, this invention relates to orienting a work piece having a set of geometrically arranged protuberances thereon; still more specifically, to a semiconductor chip orienting apparatus for engaging, centering and angularly orienting a semiconductor provided with a set of ball terminals arranged in a triangular configuration.

With the advent of hybrid transistor circuit technology, there arose more stringent requirements of precision, speed and uniformity than had theretofore been achieved in the art of automated circuit manufacture. This hybrid technique involves first the screen printing of the resistors and conductive lands on an alumina substrate. The transistors or diodes in the form of semiconductor chips are then positioned onto the conductive lands. Because the chips are almost microscopic in size, each measuring 0.028 inch square, and are joined to the lands by contact elements in the form of copper balls which are only 0.005 inch in diameter, they cannot be handled by conventional automated assembly techniques. The problem is further complicated by the need for extreme accuracy and precision in positioning the chips on the relatively small and closely-spaced conductive lands which are only 0.005 to 0.015 inch wide and 0.005 inch apart, as well as by the extreme delicacy of the structure involved.

Furthermore, the vast number of circuit substrates required in the manufacture of each digital computer, which is at present the primary use for this hybrid circuit technology, demands that the chip positioning operation be performed at relatively high speeds and with a high yield in order to maintain the high volume required in production. The large number of circuit substrates utilized in a single computer also demands uniformity in manufacture in order to increase the reliability of the final assembled apparatus.

Because of the very small size of the semiconductor chips, manually orienting and placing them on substrates is a very tedious, time-consuming and expensive operation. The human error in such an operation is relatively great. Since hybrid transistor circuit terminology is a very recent development, the teachings of the prior art are relatively devoid of suitable apparatus capable of performing this very precise and exacting operation of selecting chips and properly orienting them on the substrate. It can therefore be appreciated that there is a very great need for automatic apparatus that will dependably and consistently perform the above-mentioned operation.

We have invented a new work piece orienting apparatus. The orienting apparatus of our invention has a rotatable head with a means thereon for mechanically engaging a work piece in a selective angular position. The last mentioned engaging means is preferably a T-shaped protruding configuration adapted to selectively receiving a set of triangularly arranged protuberances on the work piece. Means are provided for rotatably mounting the rotatable head. Suitable drive means are provided for moving the head with a chip engaged thereto to a predetermined position.

The orienting apparatus of our invention will in use engage and center a work piece, more specifically, a very minute semiconductor chip supported on a suitable work support, and rotate it to a desired angular position in preparation of its placement on a base or substrate. The orienting apparatus will in combination with a suitable ball terminal sensing apparatus, properly orient the head to the proper position to selectively receive and seat the work piece or chip in response to a signal from the sensing apparatus. After the work piece, or chip, has been seated on the head, a power means automatically and very precisely rotates the chip to the desired orientation relative to the supporting vacuum needle, turret and substrate. The orienting apparatus will rapidly, consistently and dependably perform the afore-described operation on work pieces, or chips, so minute that the structural features thereof are difficult to see with the naked eye.

The orienting apparatus of our invention represents a very significant advance in the automation of electrical components assembly. With our new apparatus automation in the assembling of very small electrical components into electrical circuit units becomes a practical reality.

An object of this invention is to provide a new apparatus for the orienting of work pieces.

Another object of this invention is to provide an apparatus for automatically receiving and angularly rotating a semiconductor chip having a plurality of ball terminals to a desired angular position.

Yet another object of this invention is to provide a new apparatus for orienting the position of the work piece having a plurality of protrusions thereon in which an electrical signal derived from an associated ball terminal sensor apparatus is used to place the work piece engaging element in the proper position to receive same.

Another object of this invention is to provide an apparatus adapted to mechanically engage a semiconductor chip having ball terminals thereon arranged in a geometric pattern and in which the semiconductor chip is automatically centered.

Yet another object of this invention is to provide a new orienting apparatus in which there is provided a four position stepping motor and a Geneva drive mechanism which accurately positions the head receiving the chip to both receive the chip and to subsequently orient it in a proper precise position.

Another object of this invention is to provide an orienting apparatus in which the head engaging the work piece is exposed, rugged and easy to clean.

Still another object of this invention is to provide a new orienting apparatus that is dependable in operation and relatively simple to service and maintain.

Another object of this invention is to provide an orientting apparatus that will, in response to a signal from a suitable work piece position sensing means, consistently and precisely orient a work piece engaging head to receive the work piece.

These and other objects of the invention will become apparent to those skilled in the art from the disclosure in the following specification, appended claims, and drawings.

Figure 1:
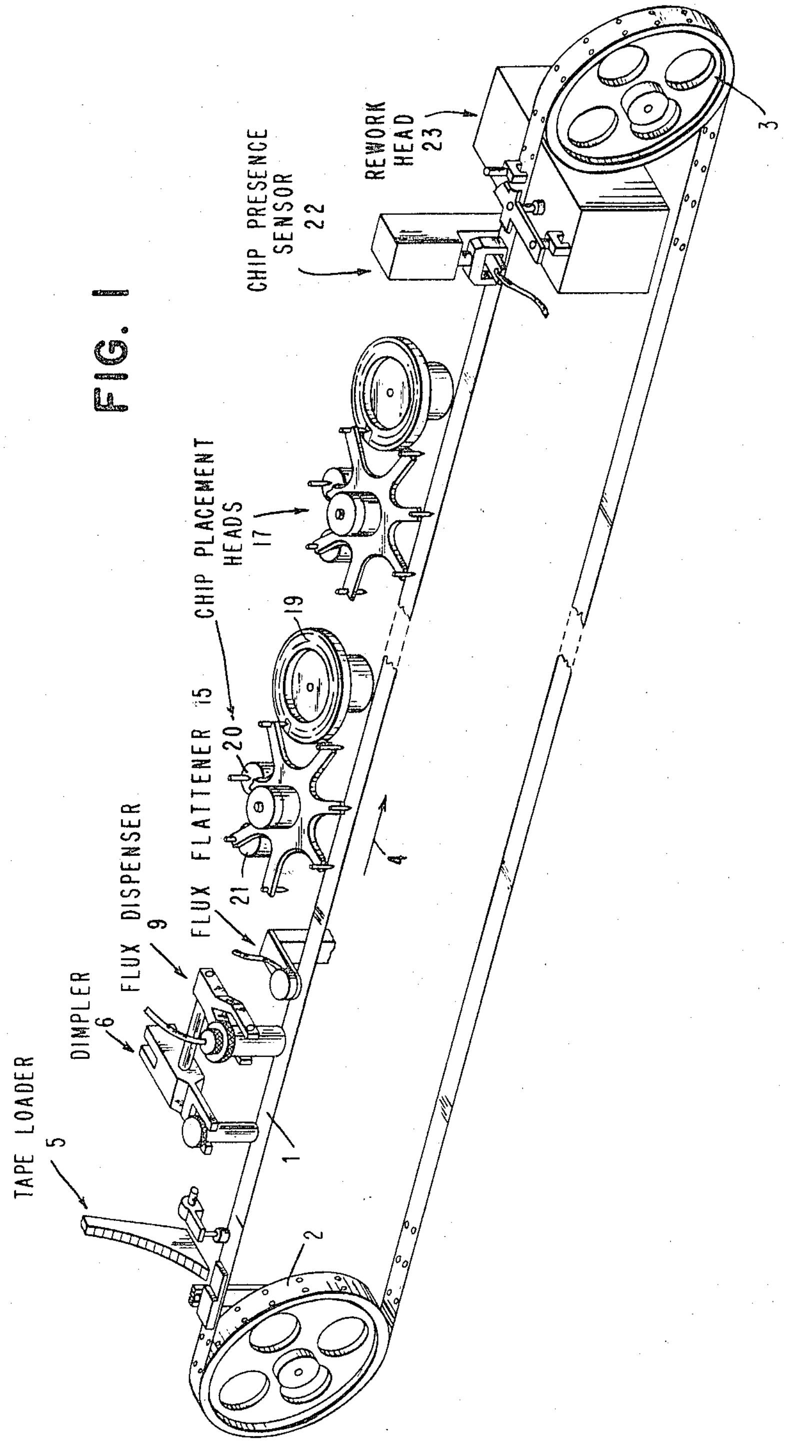
FIG. 1 is a diagrammatic view in perspective illustrating the arrangement of the chip positioning apparatus combination in which the chip T-bar orienting apparatus is a component part thereof.

The figures of the drawing and the following discussion thereof depict and describe preferred specific embodiments of the orientor apparatus of our invention, and it is to be understood that such is not to unduly limit the scope of our invention.

Referring now to the figures of the drawing, there is shown in FIG. 1 the general overall chip positioning machine combination of which the chip orientor apparatus of this application is a component element thereof. Referring to FIG. 1, the successive operating stations are shown schematically. A series of substrates are carried in sequence from one station to the next by a metal conveyor tape 1 entrained around a pair of pulleys 2 and 3 so that the upper run of tape 1 moves in the direction from left to right as viewed in the drawing. Tape loader 5 constitutes the first station and loads the substrates onto tape 1.

At the next station, a dimpler 6 is provided with an array of coining punches to dimple a circular flat area 0.007 inch in diameter on each of the pads of the substrate. These flat areas are to receive the copper balls, that is the ball terminals or contacts, of the chip when the latter is placed on the substrate at the subsequent operating stations.

The next station is a flux dispenser 9 wherein droplets of flux are discharged onto the substrate area in the appropriate locations preparatory to affixing the chips to the substrate.

To reduce the flux droplet height, a flux flattener, indicated generally as 15, is provided, which emits a jet of compressed air against each of the flux droplets to flatten and spread same on the substrate.

The next station constitutes a series of rotary turret chip placement heads, indicated generally as 17. The number of chip placement heads will correspond to the number of chip to be positioned upon each of the substrates, since each head 17 positions a chip at a particular location on the printed circuit pattern.

After the substrates are carried by the tape conveyor 1 from the last of the series of chip placement head 17, the next operating station in the sequence is a chip presence sensor 22. This device tests each substrate to determine if the required number of chips have been positioned thereon. Each substrate is thereby characterized as an "accept" or "reject" and this characterization is retained in the memory circuitry of the electrical control system until the substrate is carried by conveyor 1 to a rework head 23. This final station may be selectively programmed to remove from tape conveyor 1 either all of the accepted substrates or all of the rejected substrates. Generally, it is programmed to remove all of the rejected substrates, so that the latter may be reworked, usually by operators manually positioning chips at the missing locations. The accepted substrates continue on conveyor tape 1 toward its discharge end where they are removed by suitable interface apparatus (not shown) and loaded upon a subsequent conveyor for passage through the chip bonding oven (not shown).

Referring now to the rotary turret chip placement turret head 17, there is provided at indexing stations a vibratory bowl feeder 19, a chip orientation sensor 20, and a chip T-bar orientor 21. In operation, semiconductor chips are deposited in vibratory bowl feeder 19 where they are manipulated to a pickup station in an upright position with the ball terminals down. The chip is then picked up by the probe or vacuum needle 18 and indexed to chip orientation sensor 20. At the chip orientation sensor 20, the chip is lowered on the vacuum needle 18 to a sensing station wherein there is produced in response to the position of the ball terminals an electrical signal which is transferred to chip T-bar orientor 21. With the proper circuitry the electrical signal is utilized to position the T-bar head of the chip T-bar orientor to receive and seat the ball terminals of the chip in engagement therewith so that it can be rotated to the desired relative position. After the semiconductor chip has been oriented it is indexed to the tape conveyor 1 and properly positioned on a substrate.

A more comprehensive and detailed discussion and description of the components, electrical circuitry, etc. of the chip positioner apparatus is contained in copending and commonly assigned U.S. application Ser. No. 459,179, entitled, Chip Positioning Machine.

CHIP T-BAR ORIENTOR

After the semiconductor chip C has been picked up on the vacuum needle 18, the position of the ball contacts B is determined by the chip orientation sensor 20. Since there are four possible positions that the ball contacts B can assume, since the chip is square in shape, the probability is that three out of four times the chips will need to be oriented to the proper position on the probe prior to its placement on the substrate. This function is performed by the chip T-bar orientor 21. A preferred specific embodiment of the chip orientor unit is depicted in FIGS. 2 through 6.

In general, the chip C while held on the probe or vacuum needle 18 is rotated to the desired position by the chip orientor 21. The chip orientor 21 has a head **2*t* provided with a T-shaped configuration 3*t*, which when properly oriented with the chip will form a mechanical engagement with the triangularly arranged ball terminals on the lower side of the chip. The mechanical engagement between a typical semiconductor chip C and the T-shaped configuration 3*t* on head 2*t* is clearly illustrated in FIGS. 2, 3 and 4 of the drawings. As shown, the two sectors 18*t* on opposite sides of the upright bar of the T-shaped configuration are each defined by a pair of downwardly inclined intersecting planar surfaces, while the sector 19*t*** is defined by a single downwardly inclined planar surface. This configuration has the function of accurately centering the ball terminals B of chip C. Thus, the chip is aligned with reference to the ball contacts, rather than the side edges of the chip. The position of the balls is critical in the positioning of the chip on the substrate.

Figure 5:
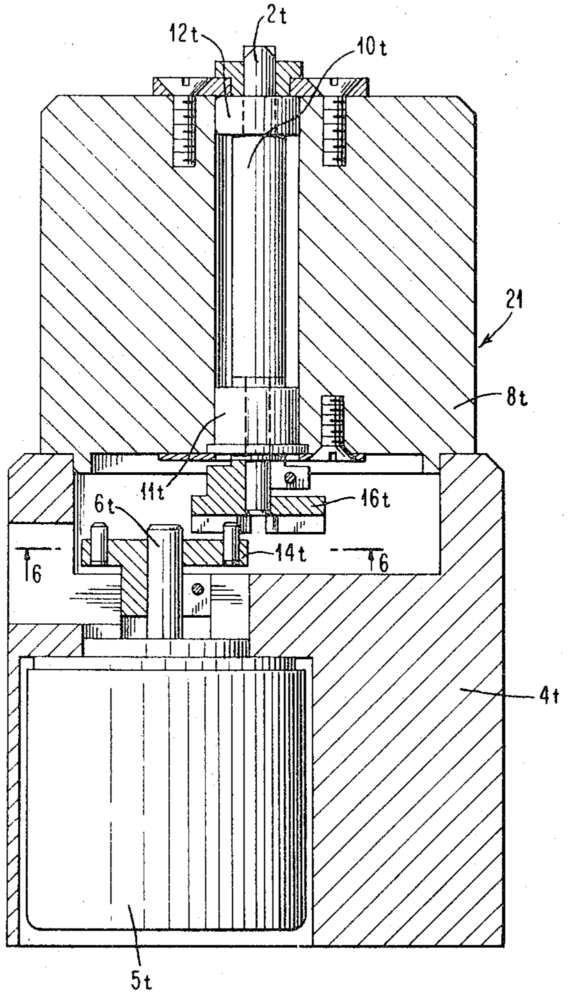
FIG. 5 is a front elevational view in cross-section of a preferred specific embodiment of the chip T-bar orientor apparatus of our invention.
Figure 2:
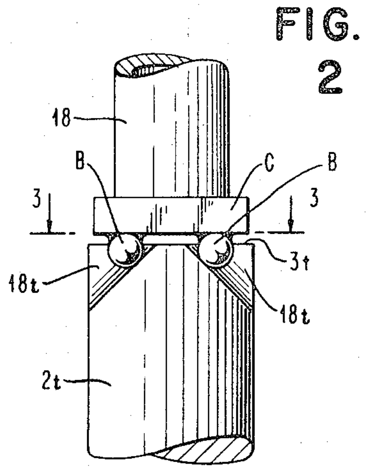
FIG. 2 is a side elevational view in enlarged scale showing the engaging relationship between the semi-conductor chip and the head of the orientor apparatus of this invention.
Figure 3:
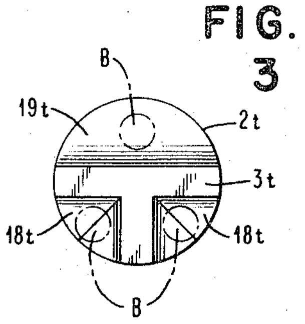
FIG. 3 is a top plan view taken on line 3—3 of FIG. 2.
Figure 6:
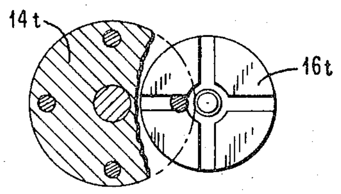
FIG. 6 is a detailed view in broken section illustrating the Geneva drive arrangement.
Figure 4:
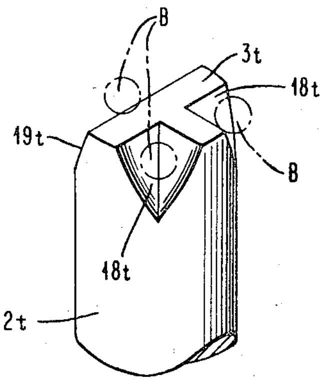
FIG. 4 is a perspective view in enlarged scale illustratng the T-bar configuraton of the head of a preferred specific embodiment of the orienting apparatus of our invention.

The chip T-bar orientor 21 has a base **4*t* in which is mounted a four-position stepping motor 5*t*. The motor 5*t* is mounted with the shaft 6*t* in an upright vertical position as shown in FIG. 5 of the drawings. A head support 8*t* is mounted on the top of base 4*t* above motor 5*t*. Shaft 10*t* is rotatably mounted in head support 8*t* by two bearings 11*t* and 12*t*. The head 2*t* with the T-shaped configuration facing upwardly is rigidly fixed to shaft 10*t* and protrudes above the top of head support 8*t*. The shaft 6*t* of motor 5*t* is connected in driving relation to shaft 10*t* by a Geneva drive mechanism consisting of a Geneva driver 14*t* and a Geneva wheel 16*t***, as illustrated in FIG. 5. A detailed view of the Geneva drive mechanism is shown in FIG. 6.

In operation an electrical signal produced by the chip orientation sensor 20, described previously, is utilized to drive motor **5*t* to thereby position the head 2*t* in the proper relative position to engage the ball terminals B of the chip C when it is transferred to the chip orientor 21. The Geneva drive mechanism provides a very precise positioning of the head 2*t*. Even in the event that the motor 5*t* stops several degrees from the exact desired angular location, this discrepancy will not cause a material change in the positioning of the head 2*t*. When the head 2*t* is rotated to the proper position, the probe 18 with a semiconductor chip affixed will be lowered by the turret head 17 into engagement with the head 2*t*. The motor 5*t*** is then actuated by a suitable circuit arrangement to rotate the head $2t$ and also the chip relative to the pickup probe to the desired position which will then permit it to be properly placed on the substrate. The chip C is thus properly oriented on the probe 18 of turret placement head 17 relative to substrates being indexed on tape conveyor 1. The critical positioning is properly orienting the ball terminals so that they will contact the lands of the printed circuitry. The orientor of our invention very precisely positions the ball terminals B with the sloping surfaces of the sectors $18t$ and $19t$ of head $2t$. Even though the ball terminals B may be slightly dislocated on the chip relative to the edges thereof, an accurate positioning of the chip is obtained both angularly and in the $x$–$y$ plane.

While the present invention has been particularly shown and described with reference to preferred embodiments, it will be understood by those skilled in the art that changes and modifications in form and detail may be made without departing from the spirit and scope of the present invention.

What is claimed is:

1. An apparatus for successively angularly orienting semiconductor chips having three ball terminals arranged in a triangular relation comprising, a rotatably mounted head having a T-shaped protruding configuration, said T-shaped configuration defined by two sectors each having downwardly inclined sloping surfaces, and a single sector having a single downwardly sloping surface, a head support for rotatably mounting said head, a base, a four position stepping motor mounted in said base, a Geneva drive operatively connecting said motor and said head in driving relation, said T-shaped configuration on said head adapted to engage, and center a chip, when seated thereon, and said motor adapted to rotate said chip to a predetermined angular position.

2. An apparatus for orienting semiconductor chips having three ball terminals arranged in triangular relation comprising, a rotatably mounted head having a T-shaped protruding configuration, a head support for rotatably mounting said head, a base, a four position stepping motor mounted in said base, a Geneva drive operatively connecting said motor and said head in driving relation, said T-shaped configuration of said head adapted to engage and center a chip, and said motor adapted to rotate said head with said chip seated thereon to a predetermined angular position.

3. An apparatus for orienting semiconductor chips having protruding terminals arranged in a triangular relation comprising, a rotatably mounted head having a generally T-shaped protruding configuration, a means for rotatably mounting said head, a four position stepping motor mounted relative to said head, a Geneva drive operatively connecting said motor and said head in driving relation, said T-shaped configuration on said head adapted to mechanically engage and center a chip, and said motor adapted to rotate said head with said chip seated thereon to a predetermined angular position.

4. An apparatus for orienting a work piece having a plurality of geometrically arranged projections thereon comprising, a rotatably mounted head having a protruding configuration adapted to selectively seat said projections of said work piece, a means for rotatably mounting said head, a multi-position stepping motor, a Geneva drive operatively connecting said motor and said head in driving relation, said configuration on said head adapted to engage and center a chip seated thereon, and said motor adapted to rotate said workpiece to a predetermined angular position.

5. An apparatus for angularly orienting a semiconductor chip having three ball terminals arranged in a triangular relation comprising, a rotatably mounted head having a T-shaped protruding configuration, said T-shaped configuration defined by two sectors each having downwardly inclined intersecting sloping surfaces, and a single sector having a single downwardly sloping surface, a head support for rotatably mounting said head, a four position stepping motor mounting relative to the head, drive means operatively connecting said motor and said head in driving relation, said T-shaped configuration ot said head adapted to engage and center a chip thereon seated thereon, and said motor adapted to rotate said chip to a predetermined angular position.

6. A work piece orientor apparatus comprising, a rotatable head having means for selectively seating a work piece, a means for rotatably mounting said head, a multi-position stepping motor mounted relative to said head, a Geneva drive operatively connecting said motor and said head in driving relation, said means for selectively seating a work piece adapted to mechanically engage a work piece, and said motor adapted to rotate head and said work piece to a predetermined angular position.

7. An apparatus for orienting a workpiece having the plurality of geometrically arranged projections thereon comprising:

a movable head, a means for rotatably mounting said movable head, a workpiece engaging configuration on said head to engage the geometrically arranged projections on a workpiece to accurately position said workpiece relative to said projections, said configuration including an upper surface, and at least two pairs of intersecting substantially planar surfaces that are inclinded relative to said upper surface, said pairs of surfaces adapted to engage and center said projections to precisely locate said workpiece in the plane generally parallel to said upper surface with said projections as a reference, a drive means for rotating said head to a predetermined angular position, said apparatus adapted to rotate said workpiece when the projections thereof are in engagement with said surface configuration to a predetermined angular position, and simultaneously position the projections of said workpiece.

References Cited by the Examiner

UNITED STATES PATENTS

| | | | |
|---|---|---|---|
| 2,652,139 | 9/1953 | Baehr | 198—33 |
| 2,845,164 | 7/1958 | Stahl | 198—33 |
| 3,198,311 | 8/1965 | Lajoie | 198—33 |
| 3,240,332 | 3/1966 | Grunwald | 198—33 |

EVON C. BLUNK, *Primary Examiner.*

EDWARD A. SROKA, *Examiner.*